(12) United States Patent
Moussavi et al.

(10) Patent No.: US 8,031,011 B2
(45) Date of Patent: Oct. 4, 2011

(54) DIGITALLY CONTROLLED OSCILLATORS

(75) Inventors: Mohsen Moussavi, Kanata (CA);
William W. Bereza, Nepean (CA)

(73) Assignee: Altera Corporation, San Jose, CA (US)

( * ) Notice: Subject to any disclaimer, the term of this patent is extended or adjusted under 35 U.S.C. 154(b) by 97 days.

(21) Appl. No.: 12/163,808

(22) Filed: Jun. 27, 2008

(65) Prior Publication Data

US 2009/0322435 A1 Dec. 31, 2009

(51) Int. Cl.
*H03K 3/03* (2006.01)
*H03C 3/22* (2006.01)
(52) U.S. Cl. ............ 331/57; 331/36 C; 331/177 V
(58) Field of Classification Search .............. 331/57, 331/177 V, 36 C
See application file for complete search history.

(56) References Cited

U.S. PATENT DOCUMENTS

| | | | |
|---|---|---|---|
| 4,586,025 A | 4/1986 | Knierim | |
| 5,382,955 A | 1/1995 | Knierim | |
| 6,208,212 B1 * | 3/2001 | White | 331/57 |
| 6,222,476 B1 | 4/2001 | Lee et al. | |
| 6,298,459 B1 | 10/2001 | Tsukamoto | |
| 6,396,358 B1 * | 5/2002 | Poss et al. | 331/57 |
| 7,046,098 B2 * | 5/2006 | Staszewski | 331/158 |
| 7,187,243 B2 * | 3/2007 | Konno | 331/57 |
| 7,268,635 B2 | 9/2007 | Meltzer | |
| 7,646,257 B2 * | 1/2010 | Gailus et al. | 331/177 V |
| 2003/0133522 A1 | 7/2003 | Staszewski et al. | |
| 2007/0152763 A1 | 7/2007 | Mansuri | |
| 2007/0152764 A1 * | 7/2007 | Lin | 331/57 |
| 2007/0188255 A1 * | 8/2007 | Strandberg | 331/177 V |
| 2007/0262887 A1 | 11/2007 | Matsuura et al. | |
| 2008/0284529 A1 * | 11/2008 | Refeld et al. | 331/57 |
| 2008/0297267 A1 * | 12/2008 | Thaller | 331/117 R |
| 2009/0085681 A1 * | 4/2009 | Lin et al. | 331/111 |

OTHER PUBLICATIONS

Tierno et al. "A Wide Power Supply Range, Wide Tuning Range, All Static CMOS All Digital PLL in 65 nm SOI", Journal of Solid-State Circuits, vol. 43, Issue 1, pp. 42-51, Jan. 28, 2008.
U.S. Appl. No. 12/111,146, filed Apr. 28, 2008, Xiao et al.

\* cited by examiner

*Primary Examiner* — Levi Gannon
(74) *Attorney, Agent, or Firm* — Treyz Law Group; G. Victor Treyz; David C. Kellogg

(57) ABSTRACT

Oscillator circuitry is provided that is based on a ring of inverters. The ring of inverters may be single-ended or differential inverters. Digitally controlled adjustable load capacitors may be provided at inverter outputs to tune the oscillator circuitry. Each digitally controlled adjustable load capacitor may be formed from multiple varactors connected in parallel. Each varactor may have a control input that receives a digital control signal. The digitally controlled adjustable load capacitors in a given oscillator may be adjusted in unison to produce the same capacitance value for each capacitor or may be adjusted individually so that they produce different capacitance values. The inverters may include common-mode-gain reduction features such as series-connected current sources, series-connected resistors, and cross-coupled negative feedback transistors.

3 Claims, 12 Drawing Sheets

| ON1 | ON0 | OP1 | OP0 |
|---|---|---|---|
| 0 | 0 | 0 | 0 |
| 0 | 0 | 0 | 1 |
| 0 | 0 | 1 | 1 |
| 0 | 1 | 1 | 1 |
| 1 | 1 | 1 | 1 |
| 1 | 1 | 1 | 2 |
| 1 | 1 | 2 | 2 |
| 1 | 2 | 2 | 2 |
| 2 | 2 | 2 | 2 |
| 2 | 2 | 2 | 3 |

DIGITALLY CONTROLLED OSCILLATORS

BACKGROUND

This invention relates to integrated circuits, and more particularly, to oscillator circuitry for integrated circuits.

Digital integrated circuits often contain analog circuitry. For example, some digital integrated circuits contain analog phase-locked loop circuitry.

Analog circuits such as phase-locked loops may contain voltage-controlled oscillators. A typical voltage-controlled oscillator is formed from a number of inverters connected in a loop. Varactors may be provided at the output of each of the inverters. The varactors may serve as controllable sources of capacitive loading. An analog control voltage may be applied to each varactor to control the capacitance produced by that varactor. When the varactors are adjusted so that they produce relatively large capacitances, the inverters in the loop will switch relatively slowly and the output of the voltage-controlled oscillator will have a relatively low frequency. When the varactors are adjusted so that they produce relatively small capacitances, the inverters in the loop will switch relatively quickly and the output of the voltage-controlled oscillator will have a relatively high frequency.

As integrated circuit dimensions shrink with advances in integrated circuit processing technology, it is becoming increasingly difficult to migrate previous generations of analog circuit designs to next generation platforms. This is because analog circuits may be sensitive to changes in transistor speed and other circuit parameters that are directly affected by the alterations that are made to the transistors and other components on an integrated circuit when using an updated fabrication process.

Analog circuits may also be more susceptible to noise than digital circuits. For example, analog circuits such as voltage-controlled oscillators may be susceptible to noise on their voltage control inputs. Digital designs may be more immune to undesired changes resulting from process updates. Digital designs may also be more accurate than analog designs in some circumstances.

It would therefore be desirable to be able to provide digitally controlled oscillator circuits for integrated circuits.

SUMMARY

In accordance with the present invention, oscillator circuits are provided that are formed from rings of inverters. The inverters may be single-ended inverters or may be differential inverters. Digitally controlled adjustable load capacitors may be provided at the outputs of the inverters. The capacitance values that are produced by the capacitors may be adjusted to have high values when it is desired to lower the frequency of the oscillator output and may be adjusted to have low values when it is desired to raise the output frequency of the oscillator. Wide frequency tuning ranges and accurate tuning may be achieved by using digital control arrangements.

With one suitable configuration, each load capacitor may be formed from multiple varactors connected in parallel. The varactors may be formed from devices such as reverse biased diodes and metal-oxide-semiconductor capacitor structures. Unitary weights, binary weights, or graded non-binary weights may be used for the varactor strengths. Each varactor may have a respective control input that receives a control voltage. The control voltages that are applied to the varactor control inputs may be limited to logic low and high voltages. This use of digital control for the varactors helps to avoid operating the varactors at intermediate analog voltage levels at which the varactors are more susceptible to noise effects.

Collectively, the digital control voltages that are used to form the control signals for the varactors in each capacitor form a digital control word for that capacitor. In order to enhance the accuracy with which the output frequency of the oscillator can be adjusted while minimizing the space consumed by the digitally controlled adjustable load capacitors, a control scheme can be used in which each load capacitor in a ring oscillator can be independently controlled. With this type of arrangement, one or more of the capacitors can be adjusted to produce capacitance values that are different from other capacitors. Capacitance mismatches can be minimized by ensuring that the control words associated with each capacitor differ in the number of high logic signals that they contain by no more than one.

Ring oscillator performance may be enhanced by minimizing the common mode gain in the inverters of the ring oscillator. Common mode gain reduction circuitry may be incorporated into the inverters. Examples of suitable common mode gain reduction circuitry include current sources and resistors that are connected in series with the cross-coupled inverters that make up a differential inverter and flywheel-inverter-type negative feedback circuits.

Further features of the invention, its nature and various advantages will be more apparent from the accompanying drawings and the following detailed description of the preferred embodiments.

BRIEF DESCRIPTION OF THE DRAWINGS

FIG. 11 is a table showing how the adjustable capacitors in a digitally controlled oscillator may be adjusted to avoid excessive capacitance mismatches when the adjustable capacitors associated with different inverter output nodes have different capacitances in accordance with an embodiment of the present invention.

DETAILED DESCRIPTION

The present invention relates to integrated circuits containing oscillator circuitry. The oscillator circuitry may be used to generate a clock signal or any other suitable signal. Oscillators in accordance with the invention may be used as part of a phase-locked loop circuit, delay-locked loop, or any other suitable circuitry. The oscillator circuitry may be digitally controlled.

Digitally controlled oscillators may be based on an architecture in which multiple inverters are connected in a ring. The inverters may be single-ended inverters or may be differential inverters. Digitally controlled adjustable capacitors, which are sometimes referred to as digitally controlled varactors, may be used as adjustable loads at the outputs of the inverters.

Digitally controlled oscillators based on digitally controlled varactors may exhibit performance that is superior to conventional analog voltage controlled oscillators. For example, digitally controlled oscillators based on this type of arrangement may exhibit enhanced noise immunity.

Figure 1:
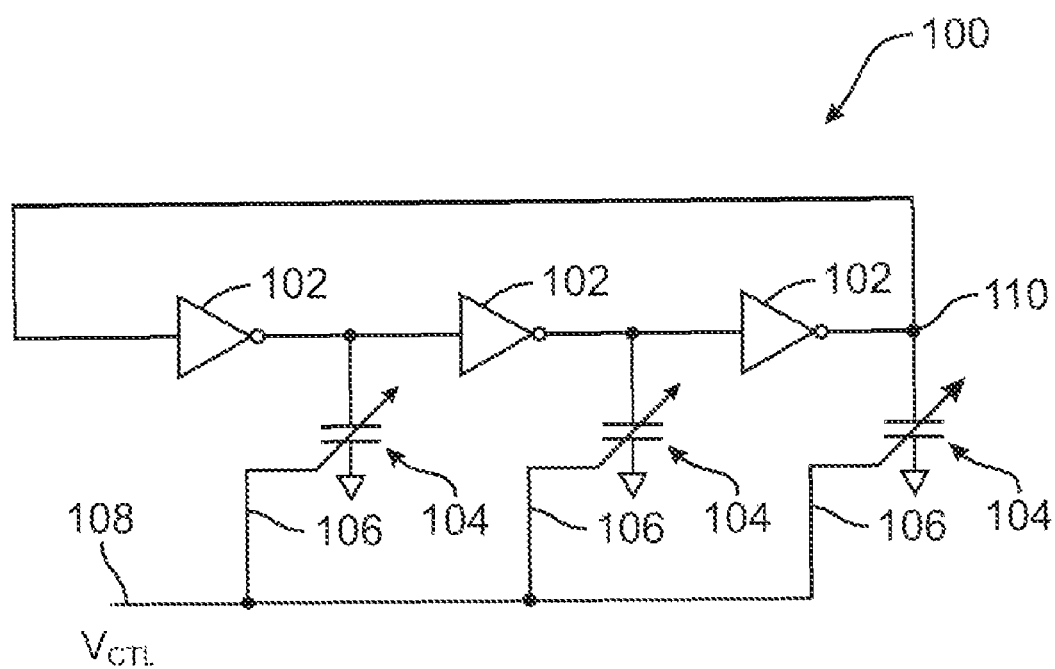
FIG. 1 is a diagram of a conventional voltage-controlled oscillator.

A conventional voltage controlled oscillator is shown in FIG. 1. As shown in FIG. 1, oscillator 100 may include a number of inverters 102 connected in a loop. A varactor (voltage-controlled capacitor) 104 is connected at the output of each inverter 102. Each varactor 104 has a capacitance that is controlled by the magnitude of the voltage on its control input 106. In the FIG. 1 arrangement, a control voltage Vctl is applied to each of the varactor control inputs 106 from input 108. Varactors 104 may be based on metal-oxide-semiconductor (MOS) capacitor structures (i.e., structures in which the gate of the capacitor forms a first terminal and in which the body of the capacitor forms a second terminal) or from reverse-biased diodes.

There are an odd number of single-ended inverters 104 in the ring of FIG. 1. This produces an unstable circuit that oscillates. The frequency at which oscillator 100 oscillates is controlled by the capacitive loading produced by varactors 104. This capacitance value is controlled, in turn, by the magnitude of the analog control voltage Vctl on input 108. The output of the circuit (e.g., the voltage at a node such as node 110) may be used in a phase-locked loop or other circuit.

The capacitance of a varactor may either have a positive or a negative voltage dependence. A typical varactor having a capacitance that drops as a function of increasing control voltage such as a reverse-biased diode may have a capacitance versus voltage characteristic of the type shown in FIG. 2. As the applied voltage Vctl rises, the capacitance of the varactor falls. When the magnitude of the applied voltage Vctl is reduced, the capacitance of the varactor increases. When used in an oscillator such as oscillator 100, this behavior changes the loading on the output nodes of inverters 102. At high Vctl levels, loading is minimized and the oscillation frequency of oscillator 100 is high, as shown in FIG. 3. At low Vctl levels, loading is maximized and oscillator 100 oscillates at a lower frequency.

Figure 2:
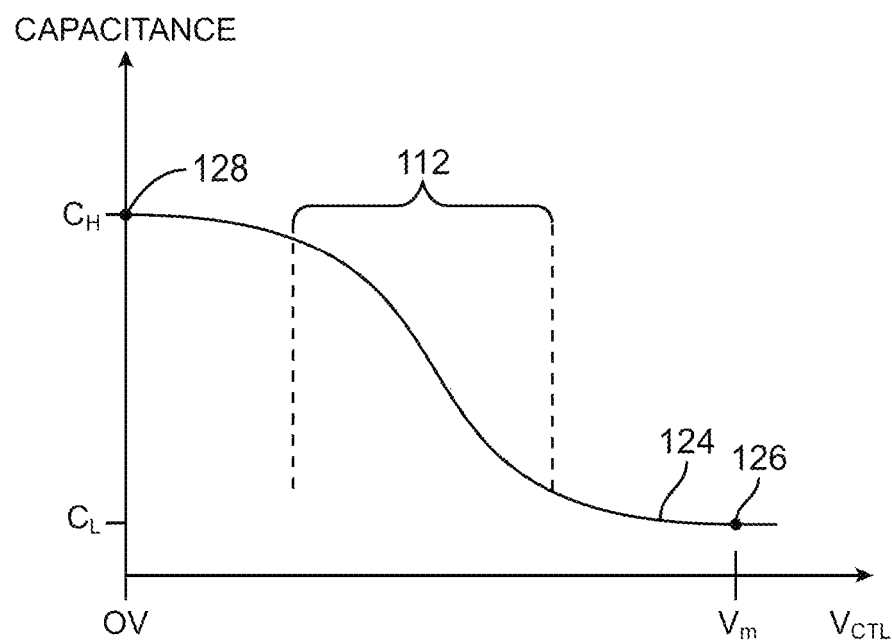
FIG. 2 is a graph showing how the capacitance of a varactor varies continuously as a function of its applied analog control voltage.
Figure 3:
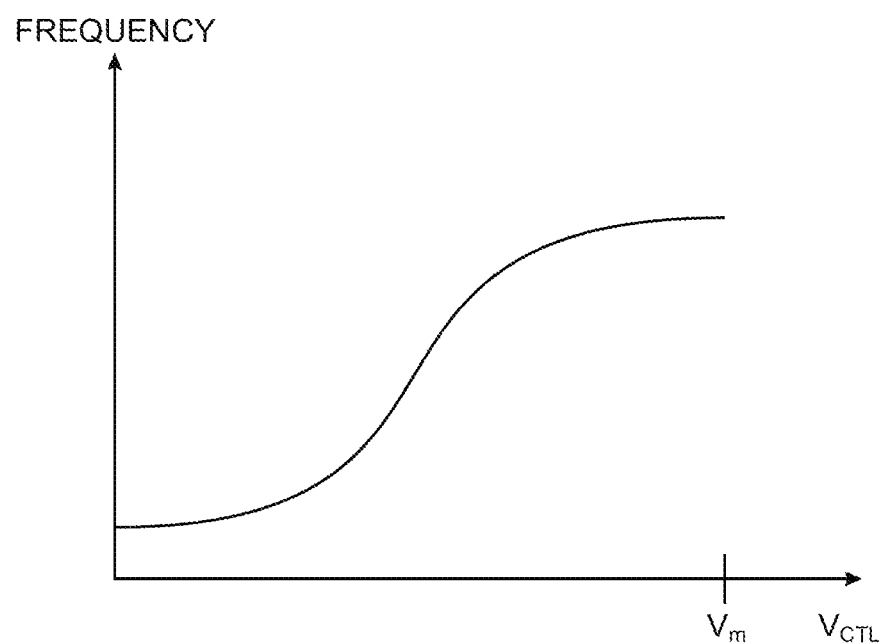
FIG. 3 is a graph showing how the frequency of a conventional voltage-controlled oscillator varies as a function of applied control voltage to its varactors.

At voltages in the middle of the varactor operating range (e.g., voltages in range 112 of FIG. 2), the capacitance of each varactor 104 is particularly sensitive to voltage variations, as indicated by the large slope of the capacitance versus control voltage graph of FIG. 2 in region 112. When the varactors 104 of FIG. 1 are operated in way that does not exclude this regime, noise on input Vctl may result in noisy operation for voltage controlled oscillator 100.

Figure 4:
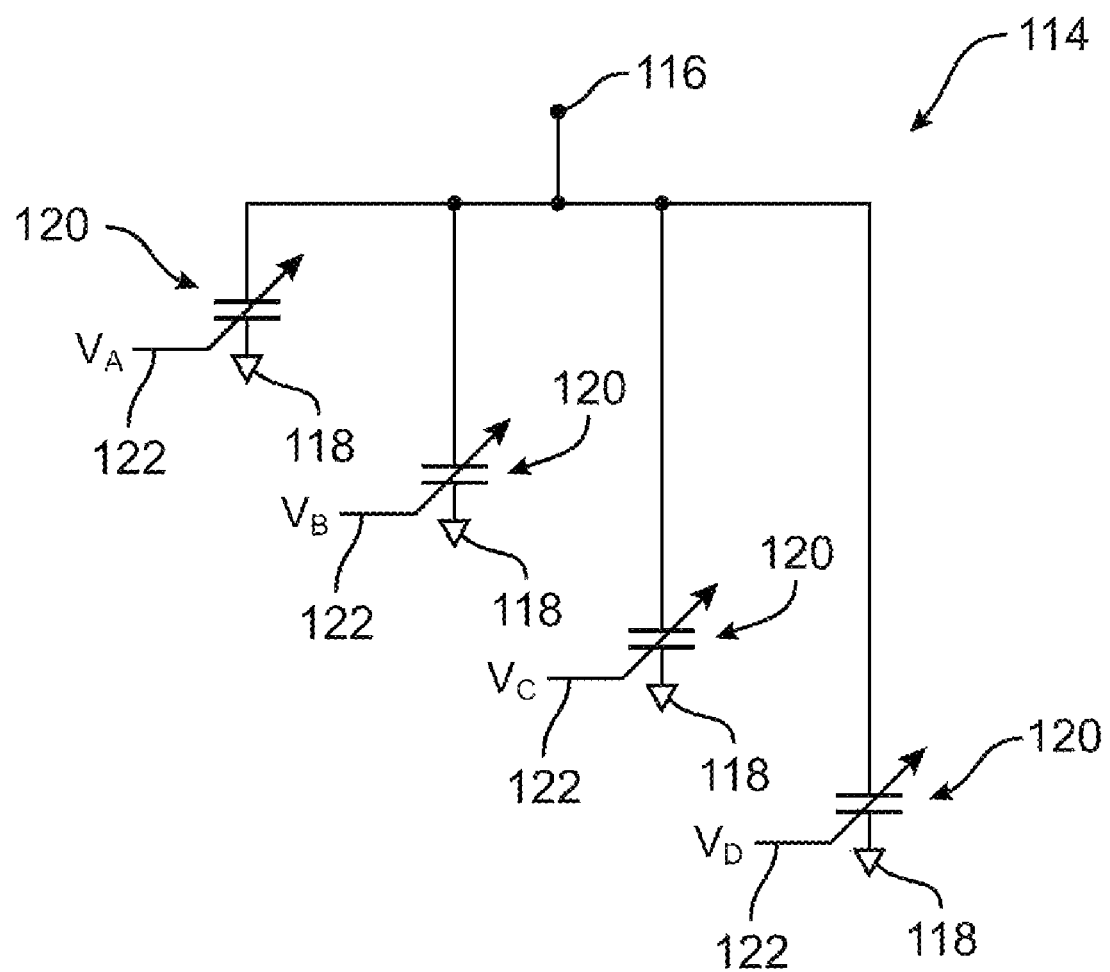
FIG. 4 is a diagram of an illustrative digitally controlled adjustable capacitor in accordance with an embodiment of the present invention.

A digitally controlled adjustable capacitor in accordance with the present invention is shown in FIG. 4. As shown in FIG. 4, capacitor 114 (which is sometimes referred to as a varactor) may be formed from multiple adjustable capacitors (varactors) 120. Capacitor 114 may produce an adjustable capacitance between terminals 116 and 118. As shown in the FIG. 4 example, node 116 may be connected to an inverter output in an oscillator ring and node 118 may be connected to ground.

The capacitors 120 that make up capacitor 114 may be connected in parallel between terminals 116 and 118 of capacitor 114. Control terminals 122 may be used to control the magnitude of the capacitance produced by each capacitor 120. For example, the leftmost capacitor 120 in FIG. 4 may receive a control voltage Va on its control terminal 122, the next-to-leftmost capacitor 120 may receive a control voltage Vb on its control terminal, etc. Although the FIG. 4 example shows a capacitor 114 that is made up of four smaller capacitors 120, capacitors such as capacitor 114 may, in general, be made up of any suitable number of capacitors. For example, capacitors such as capacitor 114 may be made up of tens, hundreds, or thousands of individual capacitors 120. The arrangement of FIG. 4 is merely presented as an example.

Unlike conventional analog varactor arrangements, capacitors 120 are controlled by digital signals, rather than analog signals. In a typical digital signal environment, digital signals are allowed to take one of two values: a logic low value or a logic high value. The logic low value may be represented by, for example, a ground voltage Vss of 0 volts. The logic high value may be represented by a fixed positive voltage. The positive logic high value may be, for example, the positive voltage associated with powering core logic on an integrated circuit. This value may be, for example, 1.2 volts, 1.1 volts, 1.0 volts, 0.9 volts, or any other suitable voltage (higher or lower). In this type of digital signaling environment, control signals for capacitors 120 such as control signals Va, Vb, Vc, and Vd in the FIG. 4 arrangement may take one of two values: high or low.

Capacitors 120 may be formed from any suitable adjustable capacitor structures such as reverse-biased p-n diodes, metal-oxide-semiconductor (MOS) capacitor structures, etc. A typical capacitor 120 may have a capacitance versus voltage characteristic of the type shown in FIG. 2. Capacitors 120 are controlled by control voltages (Va, Vb, etc.) that have only high or low values. When the control voltage on a given control line 122 is high (e.g., Vm of FIG. 2), the capacitance of the corresponding capacitor 120 will be low (e.g., at $C_L$). The slope of curve 124 is shallow in the vicinity of point 126 (e.g., for MOS and p-n diode capacitors), so fluctuations in the control voltage about Vm due to noise tend not to produce large amounts of noise on capacitor value $C_L$. When the control voltage on the given control line 122 is low (e.g., at 0 volts in FIG. 2), the capacitance of the capacitor 120 will be high (e.g. at $C_H$). As with point 126 on curve 124, the slope of line 124 at point 128 is shallow, so that fluctuations in the control voltage about the nominal 0 volt level tend not to produce large amounts of noise. Conventional varactors are controlled by analog control voltages that may bias a varactor in region 112 of FIG. 2, but this operating region is avoided in digitally controlled adjustable capacitors such as capacitor 114 of FIG. 4, thereby improving noise immunity.

Figure 5:
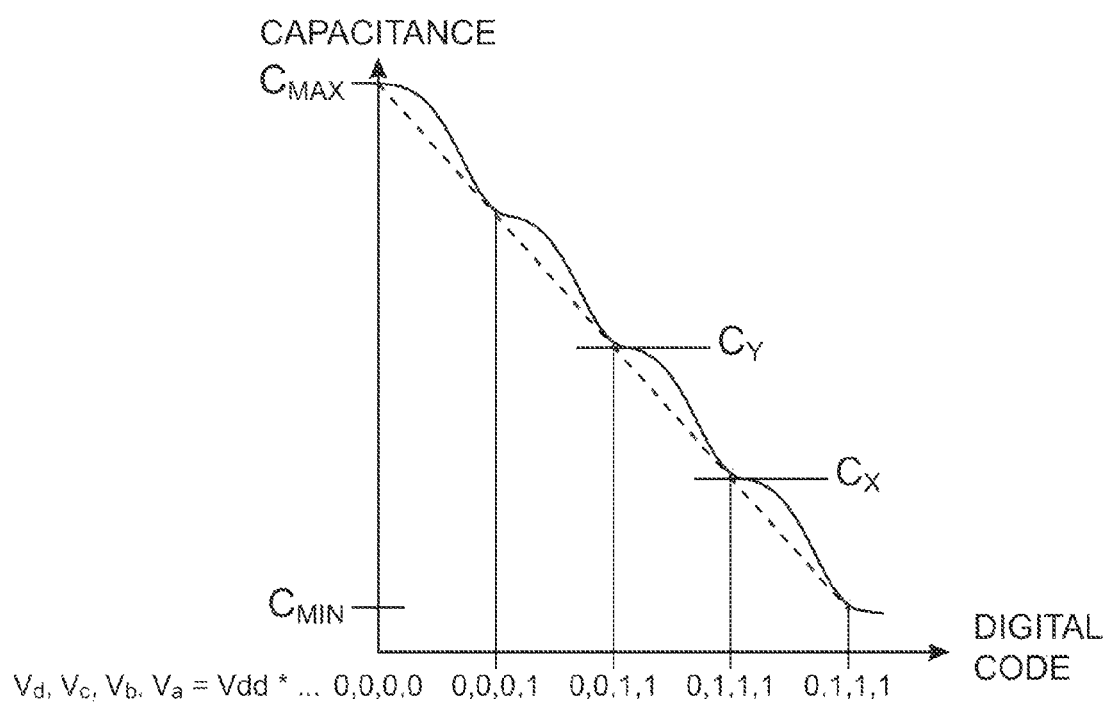
FIG. 5 is a graph showing how capacitance may vary as a function of an applied digital control word (digital code) in accordance with an embodiment of the present invention.

During operation of capacitor 114 of FIG. 4, the digital control voltages Va, Vb, Vc, and Vd form a digital control code (sometimes referred to as a digital control word). FIG. 5 shows how the capacitance of the illustrative adjustable capacitor 114 of FIG. 4 varies as a function of different control words. When, for example, Vd and Vc are low at 0 volts and Vb and Va are high at Vm, capacitor 114 will exhibit a capacitance between terminals 116 and 118 of Cy. When Vd is maintained at 0 volts while Vb, Vc, and Va are held at Vm, the capacitance of capacitor 114 will have a value of Cx. Other capacitance values between minimum value Cmin and maximum value Cmax may be produced by using other control codes. If a large amount of resolution is required for a given circuit application, the number of individual parallel-connected capacitors (varactors) 120 in capacitor 114 may be increased, although this tends to increase the amount of area required for capacitor 114 and the amount of power consumed by capacitor 114.

Digitally controlled capacitors 114 may be used in any suitable circuit. For example, ring oscillators based on single-ended or differential inverters may use digitally controlled capacitors 114 as adjustable loading capacitors.

Figure 6:
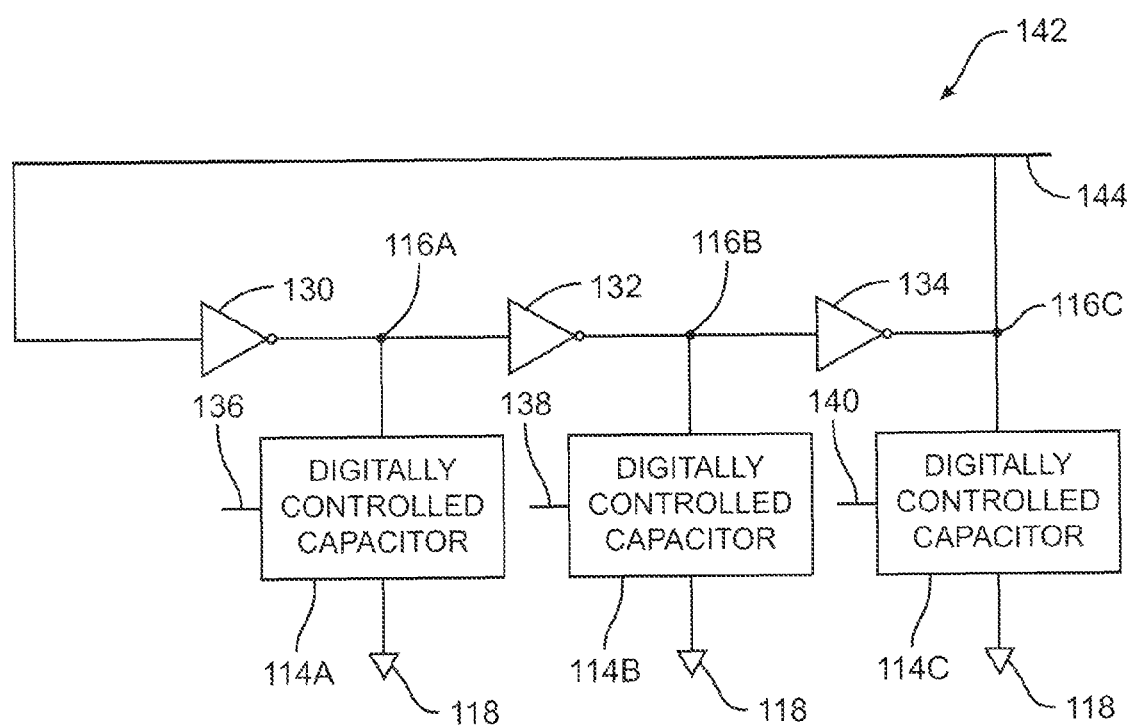
FIG. 6 is a diagram of an illustrative digitally controlled oscillator based on a loop of single-ended inverters in accordance with an embodiment of the present invention.

An illustrative ring oscillator 142 that is based on single-ended inverters is shown in FIG. 6. In the example of FIG. 6, there are three single-ended inverters. This is merely illustrative. Ring oscillators such as ring oscillator 142 may have any suitable number of inverters. In a typical arrangement, a ring oscillator based on single-ended inverters will have an odd number of inverter stages, as this ensures that the ring oscillator will not enter an undesirable stable latched state.

As shown in FIG. 6, ring oscillator 142 may have a first inverter 130, a second inverter 132, and a third inverter 134. The output of inverter 130 is connected to node 116A and forms a first of the two terminals for digitally controlled capacitor 114A. Ground terminal 118 may form the other of the two capacitor terminals for digitally controlled capacitor 114A. Inverters 132 and 134 may have their outputs connected to nodes 116B and 116C, respectively. Digitally controlled capacitor 114B is connected between node 116B and a ground node such a node 118. Digitally controlled capacitor 114c is connected between terminal 116C and terminal 118.

Each of the digitally controlled capacitors 114A, 114B, and 114C may be based on a multi-capacitor arrangement of the type shown in FIG. 4. Digitally controlled capacitor 114A may be controlled by a digital code (control word) supplied to control input 136. Digitally controlled capacitors 114B and 114C may be controlled by digital control signals provided respectively to control inputs 138 and 140.

The digital control signals that are applied to inputs 136, 138, and 140 may all be the same or some or all of these control signals may be different from each other.

For example, it may be desirable to control capacitors 114A, 114B, and 114C using identical control signals, as this will ensure that there is no capacitance mismatch between the capacitors. When there is no capacitance mismatch between the capacitors, the outputs of the inverters in the ring oscillator will all be loaded exactly the same amount. This will balance the signal delays produced by the load capacitors and will tend to maximize the quality of the signals produced by the oscillator at output 144.

An advantage of controlling capacitors 114A, 114B, and 114C using different control signals is that this type of scheme allows the total number of capacitors to be reduced for a given level of adjustability. A relatively modest amount of capacitance mismatch between the loading nodes in the ring oscillator will generally be tolerable and will produce output signals of acceptable quality. Because the capacitors are not all set to the same capacitance value, it is possible to make incremental adjustments (e.g., by changing the capacitance of only one of three capacitors 114), thereby improving accuracy (minimizing quantization phase noise) without increasing the number of capacitors. An advantage of minimizing the overall number of capacitors is that schemes that accommodate large numbers of capacitors elements tend to have large areas. Layouts of this type are typically dominated by spacing and wiring requirements and may have correspondingly large parasitic capacitances. These parasitic capacitances tend to reduce the maximum frequency that the ring oscillator can produce.

Figure 7:
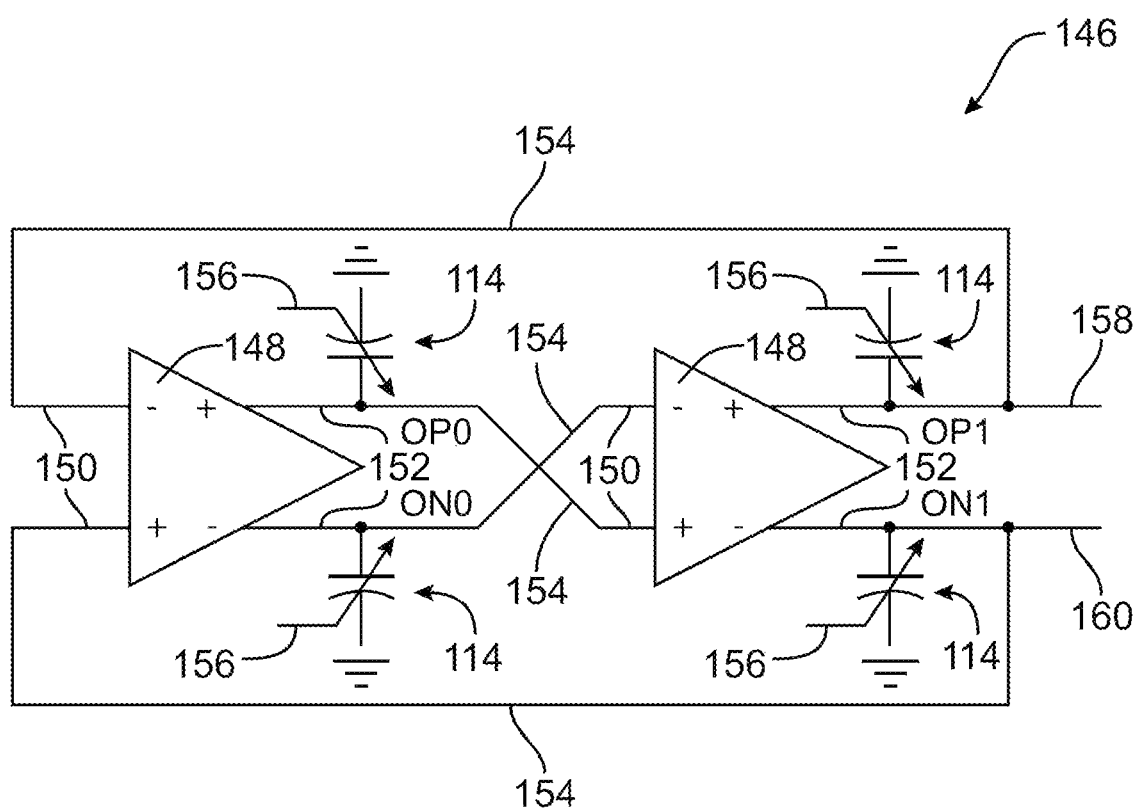
FIG. 7 is a diagram of an illustrative digitally controlled oscillator based on a loop of differential inverters in accordance with an embodiment of the present invention.

In the illustrative arrangement of FIG. 6, ring oscillator 142 is formed from a series of single-ended inverters. If desired, a ring oscillator may be formed using differential inverters. An illustrative ring oscillator of this type is shown in FIG. 7. As shown in FIG. 7, ring oscillator 146 may be formed from differential inverters 148. Ring oscillators formed from differential inverters may have an even number of inverters. In the FIG. 7 example, ring oscillator 146 has two differential inverters 148. If desired, a ring oscillator based on differential inverters may have more than two differential inverters. An advantage to using an even number of inverters in a ring oscillator is that this produces output signals with a 50% duty cycle. Signals with a 50% duty cycle may be used as clocks (as an example). Differential inverter schemes may also exhibit reduced noise sensitivity.

The differential inverters 148 each have two inputs 150 (i.e., a positive and a negative input) and two outputs 152 (i.e., a positive and a negative output). These outputs feed nodes that are labeled OP0 (positive output 0), ON0 (negative output 0), OP1 (positive output 1), and ON1 (negative output 1) in FIG. 7. In one of the sets of paths 154 between the inverters, the lines are cross-coupled, so that OP0 and ON0 are respectively connected to the positive and negative inputs of the second inverter of FIG. 7, whereas OP1 and ON1 are respectively connected to the negative and positive inputs of the first inverter of FIG. 7. In this type of arrangement, the inverters do not form a stable latch-type circuit, thereby ensuring oscillation. The signals on any of the nodes may be used as output signals. For example, the signals on lines such as lines 158 and 160 may be used as outputs.

Each of the differential inverter output nodes in ring oscillator 146 may have a respective digitally controlled capacitor 114. Each capacitor may be controlled by a potentially independent digital control word on its control path 156. Each capacitor 114 of ring oscillator 146 may be formed from multiple parallel digitally controlled capacitors such as capacitors 120 of FIG. 4. There may be tens, hundreds, or more capacitors 120 in a given capacitor 114. Each capacitor 114 in an arrangement of the type shown in FIG. 7 typically contains the same number of smaller digitally controlled capacitors 120, although arrangements with different number of capacitors 120 in each of capacitors 114 and arrangements in which some of the load capacitors are analog varactors and some of the load capacitors are digitally controlled adjustable capacitors 114 may be used if desired.

The digital control words that are applied to the control inputs 156 of capacitors 114 of FIG. 7 and control inputs 136 of capacitors 114A, 114B, and 114C of FIG. 6 may be supplied from any suitable source. For example, some or all of these signals may be produced by on-chip circuitry. Some or all of these signals may also be received from an external source. All or part of the digital control words may include or may be based on dynamic control signals. If desired, all or part of the digital control words may include or be based on static control signals that are supplied at the outputs of programmable elements. The programmable elements may be based on electrically programmed memory elements such as electrically programmable read only memory, electrically programmed fuses or antifuses, laser programmed fuses or antifuses, programmable registers, or any other suitable programmable components.

Figure 8:
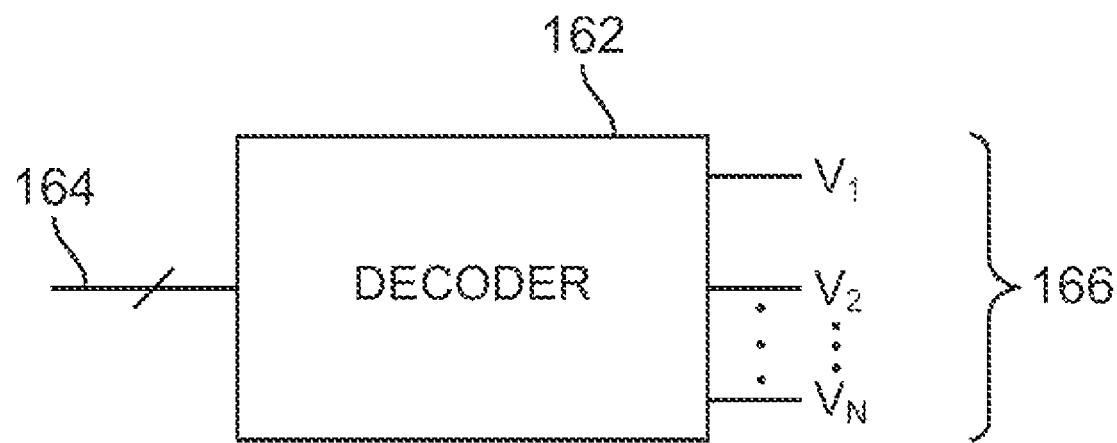
FIG. 8 is a diagram of an illustrative decoder circuit that may be used in applying control signals to digitally controlled adjustable capacitors in digitally control oscillators in accordance with an embodiment of the present invention.

Static and dynamic control signals for the digital control words may be applied directly to the control inputs of the digitally controlled capacitors or some or all of these signals may first by processed by on-chip circuitry such as a decoder circuit. An illustrative decoder is shown in FIG. 8. As shown in FIG. 8, decoder 162 may receive undecoded (binary) signals from input 164. The undecoded signals may include static control signals, dynamic control signals, static and dynamic control signals from external sources, static and dynamic control signals from internal sources (e.g., dynamic control circuitry or programmable elements that have been loaded with appropriate settings data), etc. A corresponding digital control word V1, V2, . . . VN may be produced at output 166. The individual signals in the digital control word may have, for example, values that range from digital low values Vss of 0 volts to digital high values Vdd of, for example, 1.1 volts (as an example). Each of these voltages may be applied to the control input of a varactor (adjustable capacitor) such as varactors 120 in digitally controlled capacitor 114 of FIG. 4.

Ring oscillators formed form digitally controlled capacitors may be used in any suitable circuitry on an integrated circuit. As an example, ring oscillators of this type may be used as digitally controlled oscillators in digital phase-locked loops.

Figure 9:
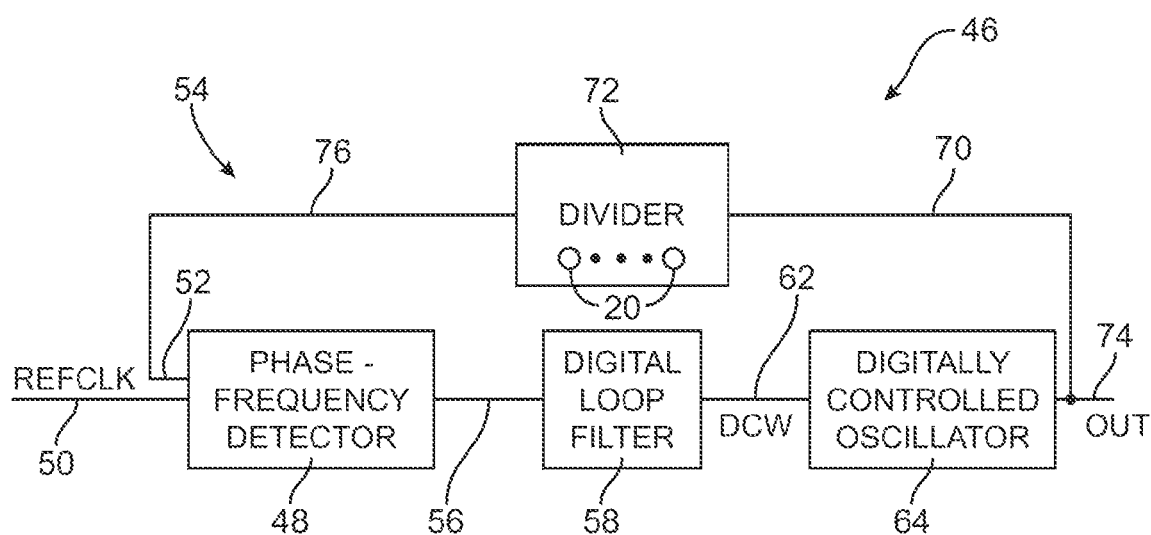
FIG. 9 is a diagram of an illustrative digital phase-locked loop that may use a digitally controlled oscillator in accordance with an embodiment of the present invention.

An illustrative digital phase-locked loop circuit in accordance with an embodiment of the present invention is shown in FIG. 9. As shown in FIG. 9, phase-locked-loop circuit 46 may have a phase-frequency detector 48. Phase-frequency detector 48 of digital phase-locked loop circuit 46 may receive a reference clock signal REFCLK or other input signal at input 50. Phase-frequency detector 48 also receives a feedback signal from feedback path 54 at input 52. Phase-frequency detector 48 compares the signals on lines 50 and 52 and generates a corresponding error control signal on path 56 for digital loop filter 58. The error signal directs filter circuitry 58 to generate a digital control word DCW on output path 60. The signal DCW may be provided in any suitable coding format such as binary or thermometer code. There may be any suitable number of conductive lines in path 62. For example, there may be tens or hundreds of lines in path 62. The digital control signal DCW on path 62 may be received by the input of digitally controlled oscillator 64. Optional decoder circuitry such as decoder 162 of FIG. 8 may be interposed in this path if desired. Within circuit 64, the digital control word or portions of the digital control word signal may be routed in parallel or separately to respective capacitors 114.

The output signal OUT on output 74 of digital phase-locked loop circuit 46 may be used as a clock signal or other signal on an integrated circuit. Integrated circuits that may include circuitry such as circuitry 46 of FIG. 9 include memory chips, digital signal processing circuits, microprocessors, application specific integrated circuits, programmable logic device integrated circuits, analog-to-digital converter circuits, or any other suitable integrated circuits.

Digitally controlled oscillator 64 may be based on a single-ended inverter architecture of the type described in connection with FIG. 6 or a differential inverter architecture of the type described in connection with FIG. 9. The digital control signal DCW on path 62 may be supplied to the control inputs of digitally controlled capacitors in the ring oscillator. The frequency of the output of digitally controlled oscillator 64 is therefore determined by the value of the digital control signal DCW that is received via input path 62.

Path 70 may be used to feed back the signal OUT from digitally controlled oscillator 64 to divider 72. Divider 72 may divide the signal OUT by an appropriate integer N (e.g., by one, by two, by more than two, etc.). If desired, the value of N may be adjusted using dynamic control signals or static control signals from programmable elements 20. The divided output of divider 72 may be provided to input 52 over line 76 in feedback path 54.

The amount by which divider 72 divides signal OUT determines the ratio between the frequency of REFCLK (or other input signal at input 50) and the frequency of output signal OUT on output path 74. For example, input IN may receive a reference clock signal at a given frequency and input OUT may provide a locked output clock signal at a frequency of N times the given frequency. In a typical scenario, the frequency of REFCLK might be 100 MHz and the frequency of OUT might be 400 MHz (as an example).

The adjustable capacitors (varactors) 120 that make up digitally controlled capacitors 114 in digitally controlled oscillator 64 can all have the same strength or may have different strengths. Strengths may be scaled by scaling the sizes of the capacitors, scaling the insulator thicknesses of the capacitors (e.g., in MOS capacitor schemes), by scaling electrode sizes, by scaling a combination of these structures, or using any other capacitor scaling scheme.

Figure 10A:
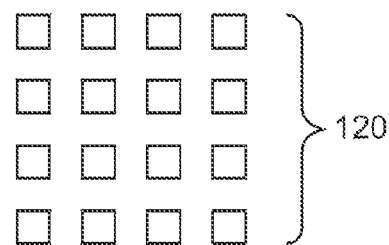
FIG. 10A is a diagram of capacitors in a digitally adjustable capacitor using a unitary weighting scheme in accordance with an embodiment of the present invention.
Figure 10B:
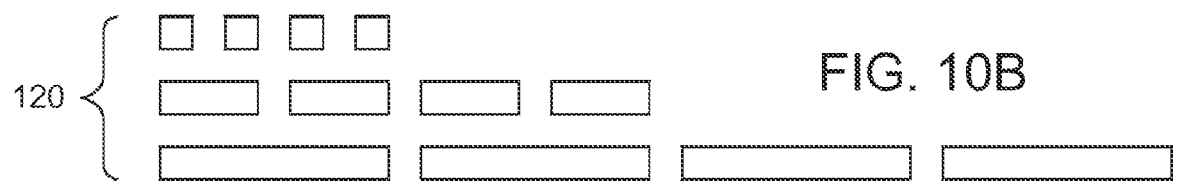
FIG. 10B is a diagram of capacitors in a digitally adjustable capacitor using a binary weighting scheme in accordance with an embodiment of the present invention.

As an example, the strengths (e.g., sizes) of capacitors 120 in capacitors 114 may be weighted so that each capacitor 120 has an equal strength (e.g., an equal size). This type of arrangement is shown in FIG. 10A. A binary weighting scheme (or a modified binary weighting scheme) may also be used, as shown in FIG. 10B. In a binary weighting scheme, capacitors 120 may be provided that are double in strength (e.g., size) relative to other capacitors 120. A desired capacitance for a given capacitor 114 may be obtained by selecting among the various available capacitors 120 of different strengths. The use of a binary-type weighting scheme may help to reduce the number of capacitors that are used in implementing digitally controlled capacitors 114.

When capacitors 120 all have the same strength (e.g., size) as shown in FIG. 10A, the digitally adjustable capacitors are sometimes said to be using a unit-weight or unitary weighting scheme. In binary-weighted schemes, it may be difficult to precisely fabricate capacitors so that the larger capacitors have precisely the capacitances desired in relation to the smaller capacitors. This is because it is often challenging to fabricate a variety of integrated circuit structures of different sizes and shapes with precisely controlled ratios. It may therefore be advantageous to fabricate capacitors 120 or other structures in a digitally controlled oscillator using a unitary weighting scheme. As shown in the example of FIG. 10A, each of the tunable capacitors in a unitary weighting scheme may have the same basic size and structure. It is generally easier to ensure that the relative sizes and shapes of the capacitors are controlled accurately (i.e., that the sizes and shapes of the capacitors are all equal) using this type of scheme. Because of these manufacturing considerations, it is generally easier to obtain high accuracy using a unitary weighting scheme than with a binary weighting scheme. Nevertheless, binary weighting and other non-unitary weighting schemes may be used if desired.

Figure 10C:
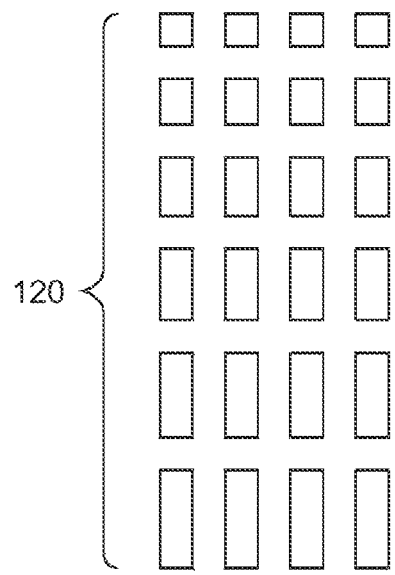
FIG. 10C is a diagram of capacitors in a digitally adjustable capacitor using a non-binary graded weighting scheme in accordance with an embodiment of the present invention.

With one suitable arrangement, the strengths (e.g., sizes) of the capacitors may be graded so as to obtain a desired frequency versus control code characteristic. The change in frequency that is exhibited by a capacitively loaded ring oscillator tends to scale with the inverse of the change in capacitance produced by the digitally controlled adjustable capacitors. As a result, a pure unit weighting scheme of the type shown in FIG. 10A may result in frequency steps that become smaller as the total capacitance of capacitors 114 reaches a maximum value. To avoid this saturation in the frequency versus capacitance characteristic of the ring oscillator, the strengths (e.g., the sizes) of the capacitors may be continuously or semi-continuously scaled from a relatively smaller value to a relatively larger value using a non-binary-weighted graded capacitor weighting scheme of the type shown in FIG. 10C. As shown in FIG. 10C, in this type of arrangement, capacitors 120 vary in strength (e.g., size), from a relatively small size to a relatively larger size. At the bottom of the capacitors tuning range, the weaker (smaller) capacitors may be used. When frequency steps are needed near the end of a ring oscillators' tuning range, the larger capacitors can be switched into use to compensate for saturation. The use of graded non-binary schemes of the type shown in FIG. 10C may therefore ensure that equal frequency steps (or frequency steps of other desired sizes) are obtained, even near the ends of the adjustable capacitor's tuning range (i.e., when the capacitance of capacitors 114 is near a maximum value).

The total number of capacitors that are needed to achieve a desired accuracy for a ring oscillator may be minimized by independently adjusting the capacitance at each inverter's output node. Because this type of scheme does not require that all capacitors be adjusted in lock step, partial capacitance steps may be obtained in which only a subset of the capacitors 114 are adjusted at a time. This approach may be used in single-ended inverter designs of the type described in connection with FIG. 6 or differential inverter designs of the type described in connection with FIG. 7.

Consider, as an example, the arrangement of FIG. 7 in which there is a capacitor 114 at each of four inverter output nodes OP0, ON0, OP1, and ON1. A table that illustrates how many capacitors 120 in each of the capacitors 114 is receiving a logic high signal on its control input 122 in each of a number of different potential ring oscillator tuning configurations is shown in FIG. 11. In the table of FIG. 11, the entries in each column indicate how many capacitors 120 are receiving a logic high signal. For example, the entries of the first column of FIG. 11 represent the number of capacitors 120 that are receiving high logic signals (e.g., voltages Vm in FIG. 2) in the capacitor 114 associated with node OP0. The remaining capacitors 120 in the capacitor 114 that is associated with node OP0 receive logic zeros (e.g., signals at 0 volts). The entries of the second, third, and fourth columns of FIG. 11 represent the number of capacitors 120 that are receiving high logic signals in the capacitors 114 respectively associated with inverter outputs ON0, OP1, and ON1.

Each row in the table of FIG. 11 represents a different potential setting for ring oscillator 146. For example, the settings of the first row correspond to a situation in which each of the capacitors 114 in ring oscillator 146 have been set to produce a maximum level of capacitance (assuming for the sake of this example, that each capacitor 120 has a capacitance versus voltage characteristic of the type shown in FIG. 2). This may be accomplished by adjusting the control voltages Vctl that are applied to the capacitors 120 in the capacitors 114 to logic low values. In this type of configuration, each capacitor 120 will produce its maximum capacitance (e.g., $C_H$) and each capacitor 114 will produce its maximum capacitance. The frequency of the output of the ring oscillator 146 will be at its minimum in this situation.

The settings of the second row indicate that the capacitors 114 at nodes ON1, ON0, and OP1 remain unchanged from the configuration of the first row. The capacitor 114 that is associated with inverter output OP0, however, has been adjusted so that one of its capacitors 120 is receiving a logic high control signal at its input 122 rather than a logic low. Because only one of the capacitors 114 has been placed in a lower capacitance state, the decrease in the output frequency f of the ring oscillator 46 is less than it would be if all capacitors 114 were tuned equally. As a result, schemes of the type shown in FIG. 11 result in more accurate tuning for ring oscillator 46 without the need to provide numerous additional capacitors 120 in each capacitor 114.

The other rows of the table of FIG. 11 show how the capacitor settings for capacitors 114 may be systematically adjusted to tune ring oscillator 46. In the third row, the capacitors at two of the nodes have been adjusted to produce their maximum possible capacitance values while two of the nodes have been adjusted to produce a lower capacitance (because one of their capacitors 120 is being supplied with a high control signal). In the fourth row, three capacitors 114 have a single capacitor 120 that is receiving a high control signal. In the fifth row, all capacitors 114 contain a single capacitor 120 with a high control signal and have their remaining capacitors 120 set to their low control signal settings. In the sixth row, the capacitors 114 that are associated with nodes ON1, ON0, and OP1 have one of their capacitors 120 in a high control signal mode while the rest of their capacitors 120 are in a low control signal mode. As indicated by the "2" entry in the last column of the sixth row, the capacitor 114 that is associated with node OP0 has two of its capacitors 120 in their high control signal modes (receiving logic high signals at their control inputs) and has the rest of its capacitors 120 in their low control signal mode (receiving logic low signals at their control inputs). Subsequent rows in the table of FIG. 11 illustrate how progressively larger number of capacitors 120 can be set to their high control signal modes in a systematic manner to adjust the output frequency f produced by ring oscillator 46.

As the example of FIG. 11 illustrates, in tuning schemes in which each capacitor 114 may be adjusted independently from the others, it is still generally desirable to adjust capacitors 114 in a way that minimizes the capacitance difference between the capacitors 114 in the pair of capacitors connected to the positive and negative outputs of a given differential inverter or between any respective pair of the capacitors 114 in an oscillator (i.e., so that the number of capacitors 120 that are receiving logic high control signals at their control inputs in any two respective capacitors 114 in the ring oscillator varies by no more than one). This ensures that the capacitive loading on the inverter output nodes is well balanced.

Figure 12:
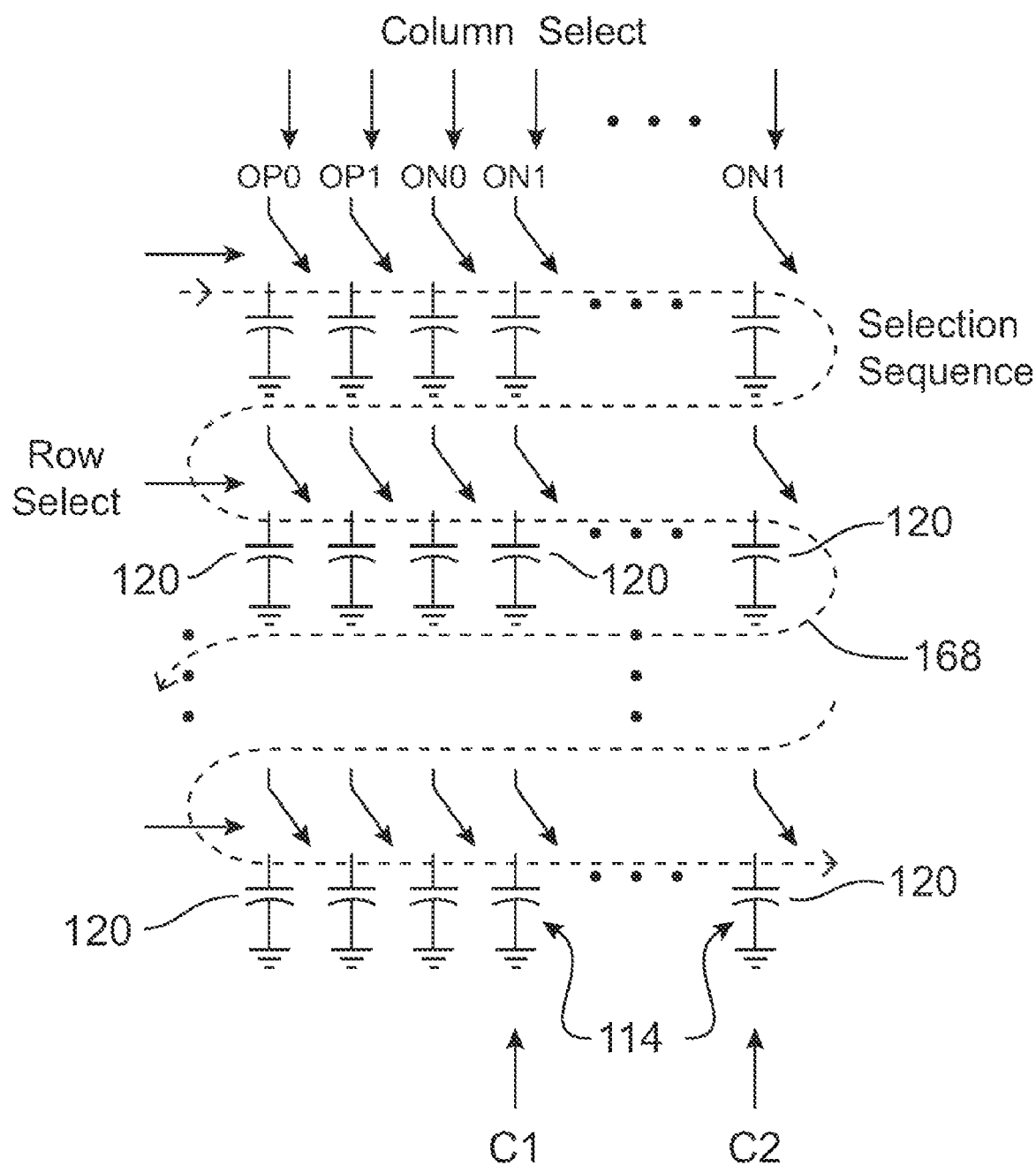
FIG. 12 is a diagram showing how an array of digitally controlled capacitors associated with digitally controlled adjustable capacitors in a digitally controlled oscillator may be systematically adjusted to avoid excessive capacitance mismatches from arising in accordance with an embodiment of the present invention.

If desired, capacitors 120 for capacitors 114 may be provided in an array on an integrated circuit. An arrangement of this type is shown in FIG. 12. In the diagram of FIG. 12, the capacitors in each column are associated with a given one of the capacitors 114. Each capacitor 114, in turn, may be constructed from more than one column of capacitors 120. In FIG. 12, the capacitor 114 that is associated with node ON1 contains capacitors from columns C1 and C2. These capacitors 120 may be connected in parallel as described in connection with FIG. 4. The capacitors 114 that are associated with the other nodes (e.g., nodes OP0, OP1, and ON0) may be constructed in the same way.

Dashed line 168 indicates a possible pattern that may be used when placing capacitors 120 in their high control signal mode while adjusting ring oscillator 46 to produce output signals of progressively higher frequencies (as an example). Initially, when it is desired to operate ring oscillator 46 at its lowest frequency, each of the capacitors receives a logic "0" at its control input 122 (FIG. 4). In this situation, all of the capacitors 120 along path 168 in FIG. 12 are controlled by corresponding "0s". To increase the frequency of the output signal produced by ring oscillator 46, logic "1s" may be selectively applied to capacitors 120 in the array of FIG. 12 using the pattern represented by dashed line 168. With this approach, all capacitors 120 will initially receive "0s" at their control inputs. A slightly higher frequency for the ring oscillator 46 may be achieved by applying a "0" to all of the capacitors except for the capacitor 120 that is associated with the uppermost and leftmost position in the array of FIG. 12 (i.e., one of the capacitors 120 associated with the capacitor 114 at node OP0). Proceeding in this way, the capacitors of array 120 may then all be provided with "0s" at their control inputs, except for the leftmost and next-to-leftmost capacitors 120 in the first row of the array (which receive "1s"). If it is desired to tune ring oscillator 46 to a still higher frequency, more "1s" may be used as capacitor control inputs, according to the pattern represented by line 168.

In the example of FIG. 12, the high signals supplied to the control inputs of capacitors 120 are incremented one at a time. If desired, frequency adjustments may be made that involve switching two, three, or more than three capacitors 120 for each step in frequency of ring oscillator 46. Schemes such as these may increase balance between inverter output nodes, at the expense of resolution.

Figure 13:
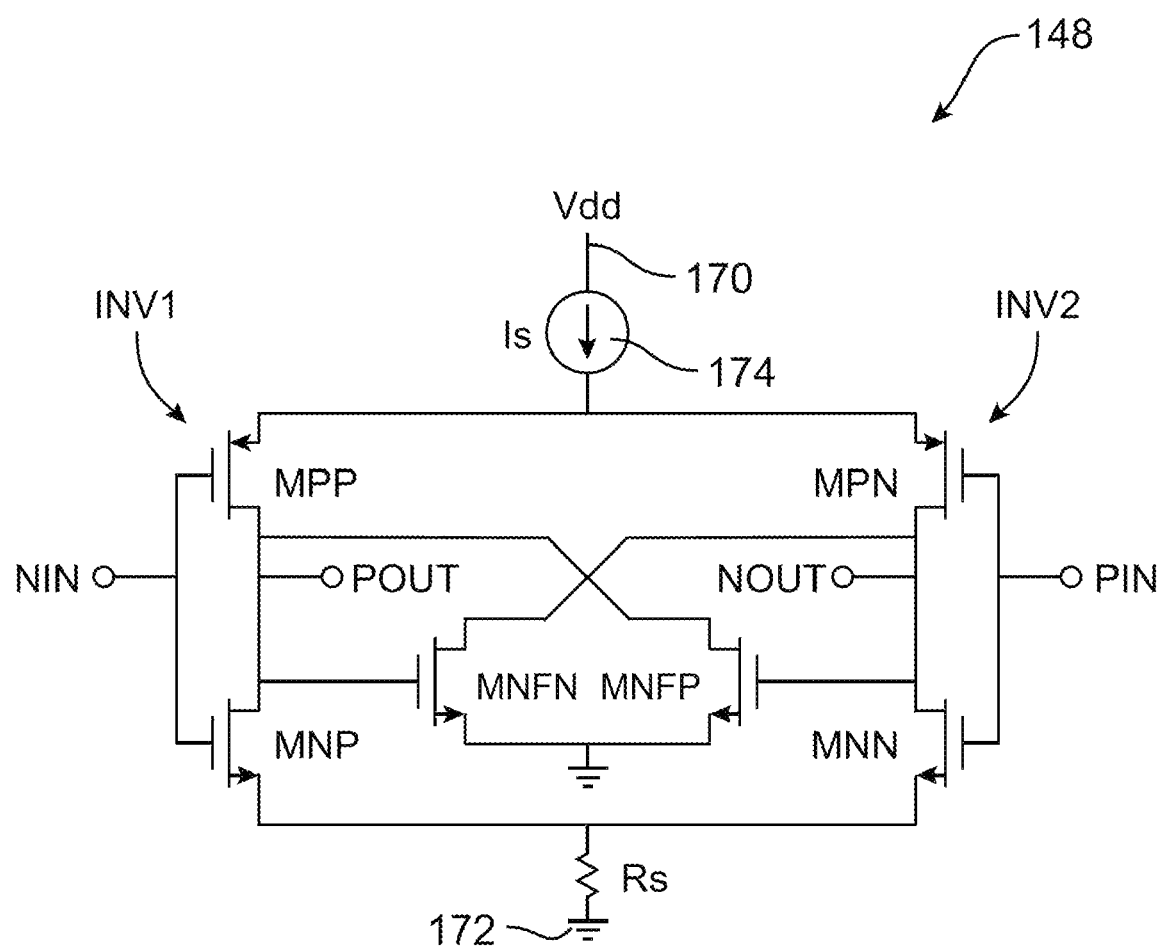
FIG. 13 is a circuit diagram of an illustrative differential inverter stage with reduced common mode gain that may be used in a digitally controlled oscillator of the type shown in FIG. 7 in accordance with an embodiment of the present invention.

Ring oscillator inverters may be implemented using any suitable circuit architecture. An example of a suitable differential inverter is shown in FIG. 13. As shown in FIG. 13, inverter 148 may have a first inverter INV1 formed by p-channel metal-oxide-semiconductor (PMOS) transistor MPP and n-channel metal-oxide-semiconductor (NMOS) transistor MNP and may have a second inverter INV2 formed from PMOS transistor MPN and NMOS transistor MNN. Inverter INV1 may receive input signal NIN and may produce output POUT. Inverter INV2 may receive input signal PIN and may produce output signal NOUT.

Differential amplifiers have finite common-mode gain. If the magnitude of this gain is larger than unity in the differential inverters of a ring oscillator, it may cause the loop in the ring oscillator to oscillate in common gain mode or to latch at an undesired DC operating point. To address this issue, inverter 148 may have features that help reduce its common mode gain relative to its differential gain.

As shown in FIG. 13, inverter 148 may be powered by a positive power supply voltage Vdd that is received at positive power supply terminal 170 and a ground power supply terminal that is received at ground terminal 172. A current source such as current source 174 may be placed in series with inverters INV1 and INV2 to help reduce common mode gain (i.e., gain of a signal that appears on outputs POUT and NOUT when inputs NIN and PIN are simultaneously both taken high or are simultaneously both taken low). Current source 174 may, if desired, be placed between ground terminal 172 and inverters INV1 and INV2, rather than between positive power supply terminal 170 and inverters INV1 and INV2 as in the FIG. 13 example. An independent current source such as current source 174 may be provided for each inverter 148 in a given ring oscillator.

Current source 174 reduces common mode gain by limiting the current to PMOS transistors MPP and MPN. In differential mode, transistors MPP and MPN share current source current Is, so there is no reduction in differential gain. If, however, a common mode signal is presented to inputs NIN and PIN, there is effectively no change in the POUT and NOUT signals (i.e., common mode gain is essentially zero). This is because the common movement of the inputs NIN and PIN results in a voltage drop that falls entirely across current source 174, not across outputs POUT and NOUT.

Resistor Rs may also help to reduce common mode gain in inverter 148. Consider an example in which NIN and PIN both fall. In this type of situation, resistor RS opposes a corresponding fall in the voltages on outputs POUT and NOUT. This is because the voltage drop across resistor Rs rises in response to the increases of NIN and PIN, thereby creating a source of negative feedback. When the voltage across resistor Rs rises, the gate to source voltage Vgs of both MNP and MNN falls. Signals POUT and NOUT may fall somewhat, but the magnitude of this fall will be less than it would be in the absence of common-mode-gain-reducing resistor Rs. Note that if the input to inverter 148 is purely differential (i.e., if NIN rises while PIN falls), one side of inverter 148 will produce an increased voltage drop contribution from Rs while the other side of inverter 148 will produce a decreased voltage drop contribution from Rs. The gain of differential signals is therefore not reduced by the presence of resistor Rs. If desired, resistor Rs may be placed in series with INV1 and INV2 in the location of current source 174 of FIG. 13 (i.e., the locations of current source 174 and resistor Rs may be swapped).

If desired, inverter 148 may be provided with common-mode-gain-reducing cross-coupled transistors such as NMOS transistors MNFN and MNFP (or full inverters). This type of arrangement is sometimes referred to as a flywheel inverter arrangement (e.g., in configurations in which two full inverters are provided in this location to reduce common-mode gain). Transistors MNFN and MNFP help to increase differential gain relative to common mode gain. Consider an example in which POUT rises in response to a fall in NIN. In this situation, the voltage on the gate of transistor MNFN rises. This makes the voltage on the drain of transistor MNFN fall. When the voltage on the drain of transistor MNFN falls, output NOUT falls. The presence of transistor MNFN therefore helps to increase the amount by which output NOUT falls in response to an increase in NIN (i.e., MNFN increase differential gain). Transistor MNFP operates in the same way on output POUT.

Inverter 148 may include a current source such as current source 174, a common-mode-gain-reducing resistor such as resistor Rs, and common-mode-gain-reducing cross-coupled transistors such as transistors MNFN and MNFP (or full cross-coupled flywheel inverters) as shown in FIG. 13 or may, if desired include one or two of these common-mode-gain reduction circuits.

The foregoing is merely illustrative of the principles of this invention and various modifications can be made by those skilled in the art without departing from the scope and spirit of the invention.

What is claimed is:

1. A method of adjusting an output signal frequency in an oscillator formed from a ring of inverters coupled to adjustable load capacitors, wherein each capacitor of the adjustable load capacitors comprises a plurality of parallel-coupled varactors, wherein each varactor of the parallel-coupled varactors has a digital control input operable to receive a digital control signal, comprising:

applying a first digital control word formed from first digital control signals to a first of the adjustable load capacitors operable to direct that first capacitor to produce a first capacitance value, wherein applying the first digital control word to the first of the adjustable load capacitors comprises applying the first digital control signals to the digital control inputs of the parallel-coupled varactors of the first of the adjustable load capacitors;

applying a second digital control word formed from second digital control signals to a second of the adjustable load capacitors operable to direct that second capacitor to produce a second capacitance value that is different from the first capacitance value, wherein applying the second digital control word to the second of the adjustable load capacitors comprises applying the second digital control signals to the digital control inputs of the parallel-coupled varactors of the second of the adjustable load capacitors; and ensuring that the first digital control word and the second digital control word contain respective numbers of logic high signals that differ by no more than one.

2. The method defined in claim 1 wherein the inverters comprise first and second differential inverters each having a positive output and a negative output to which respective ones of the adjustable load capacitors are coupled, wherein ensuring that the first digital control word and the second digital control word contain respective numbers of logic high signals that differ by no more than one comprises ensuring that the digital control word applied to the adjustable load capacitor coupled to the positive output of the first differential inverter and the digital control word applied to the adjustable load capacitor coupled to the negative output of the first differential inverter differ by no more than one.

3. A method of adjusting an output signal frequency in an oscillator formed from a ring of inverters coupled to adjustable load capacitors, comprising:

applying a first digital control signal to a first of the adjustable load capacitors operable to direct that first capacitor to produce a first capacitance value;

applying a second digital control signal to a second of the adjustable load capacitors operable to direct that second capacitor to produce a second capacitance value that is different from the first capacitance value, wherein each of the adjustable load capacitors comprises a plurality of parallel-coupled varactors having digital control inputs and wherein the digital control inputs of the varactors in each of the adjustable load capacitors are operable to receive a digital control signal that controls that adjustable load capacitor; and when applying the first digital control signal and the second digital control signal respectively to the first and second adjustable load capacitors, ensuring that the first digital control signal and the second digital control signal contain respective numbers of logic high signals that differ by no more than one to minimize capacitance mismatch between the first and second capacitance values.

\* \* \* \* \*